United States Patent [19]

Takasaki et al.

[11] Patent Number: 4,653,365
[45] Date of Patent: Mar. 31, 1987

[54] METHOD FOR PUNCHING CERAMIC GREEN SHEET

[75] Inventors: Mitsuhiro Takasaki; Hiroya Murakami, both of Yokohama, Japan

[73] Assignee: Hitachi, Ltd., Tokyo, Japan

[21] Appl. No.: 724,767

[22] Filed: Apr. 18, 1985

[30] Foreign Application Priority Data

Apr. 20, 1984 [JP] Japan ................................ 59-78445

[51] Int. Cl.⁴ .............................................. B26F 1/02
[52] U.S. Cl. .......................................... 83/50; 83/49;
  83/103; 83/71; 83/266; 83/409; 83/560
[58] Field of Search ................... 83/71, 266, 276–278,
  83/409, 410, 412–415, 559, 560, 637, 103, 50,
  55, 49

[56] References Cited

U.S. PATENT DOCUMENTS 2,866,506 12/1958 Hierath et al. ........................... 83/71
4,162,641  7/1979 Stubbings .............................. 83/412
4,209,129  6/1980 Haas ................................... 234/108
4,434,693  3/1984 Hosoi et al. ........................... 83/278
4,523,749  6/1985 Kindgren et al. .................. 83/409 X Primary Examiner—James M. Meister
Attorney, Agent, or Firm—Antonelli, Terry and Wands

[57] ABSTRACT

A punching method and apparatus for forming through holes by punching in a ceramic green sheet for use as a material of a laminated substrate. Not only the positioning of the work but also the driving of the upper die set are conducted by of servomotors with the speed and timing of operation of the servomotors being controlled in accordance with a prestored program in a microcomputer, so as to attain a high speed and efficiency of operation. In addition, a hole clearing operation is conducted immediately after the punching so that the chip remaining in the punched through hole, if any, is forced out from the through hole by the same punch used in the punching operation.

1 Claim, 8 Drawing Figures

FIG. I
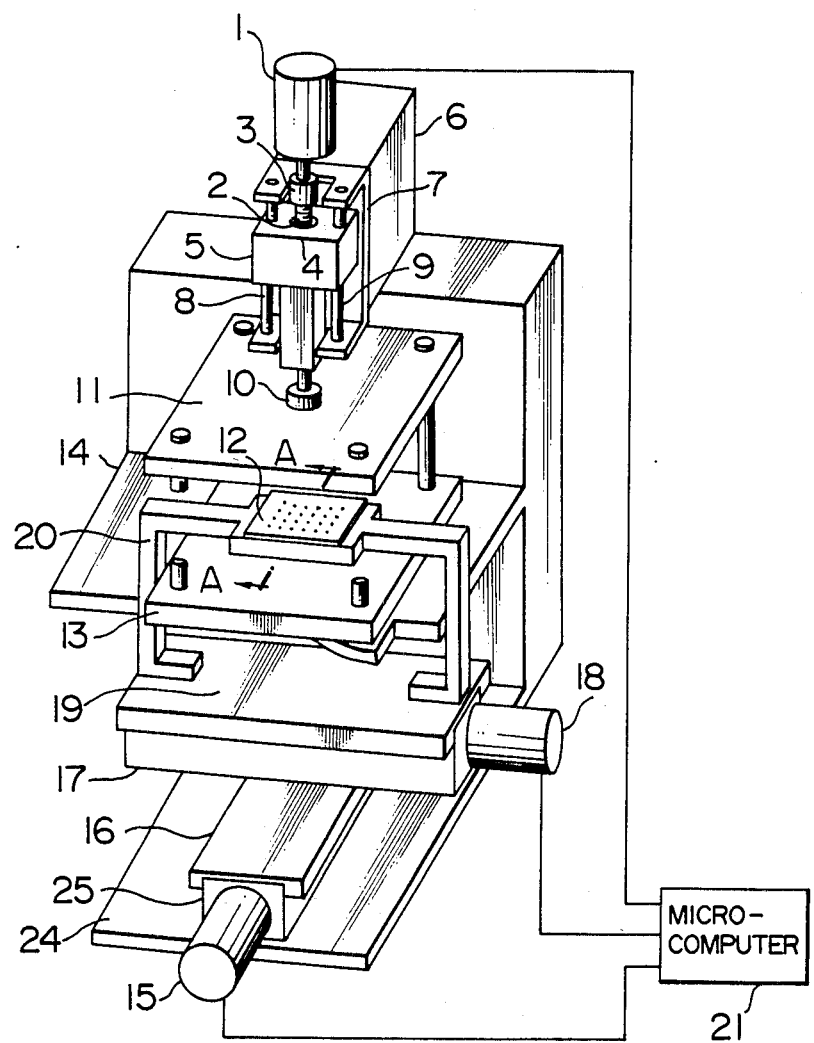

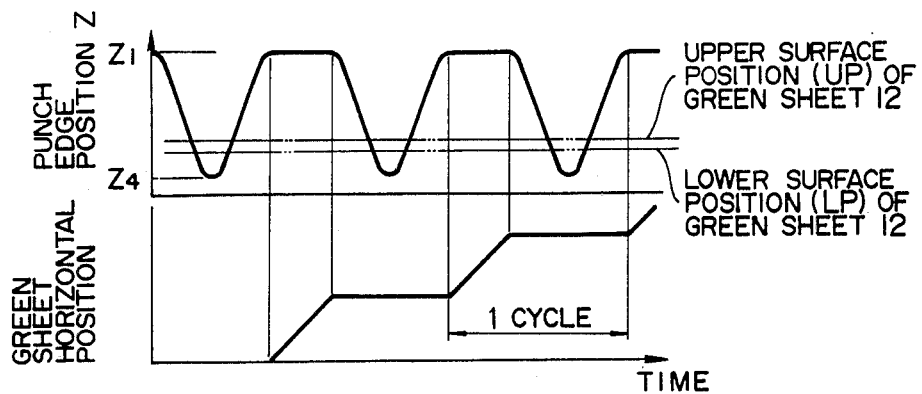
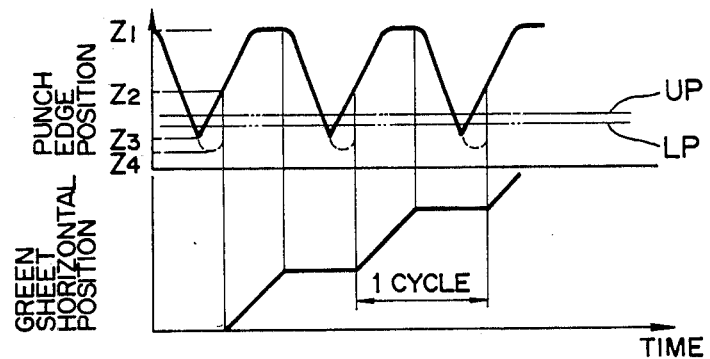
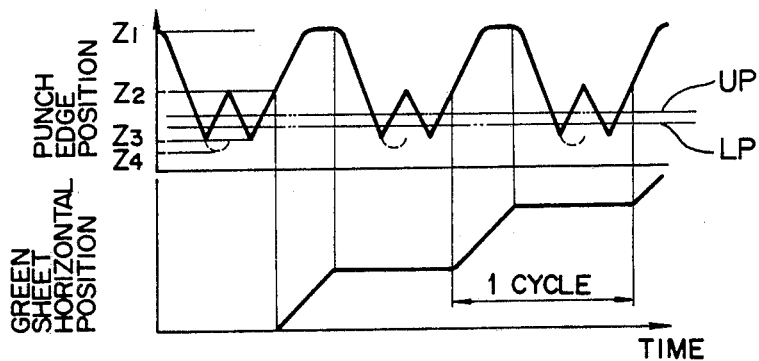

METHOD FOR PUNCHING CERAMIC GREEN SHEET

BACKGROUND OF THE INVENTION

The present invention relates to a method of and an apparatus for punching a substrate and, more particularly, to a punching method and a punching apparatus for forming through holes in a ceramic green sheet which is used as a material of, for example, laminated substrate.

In, for example, U.S. Pat. No. 4,209,129, for punching out through holes in a ceramic green sheet, the punching is effected by an upper die set which is driven vertically reciprocated through an eccentric mechanism which converts a rotational motion of a motor into a vertical linear motion.

Recently there has been a great demand for a punching method and apparatus which permits an easier, quicker and more flexible change and setting of working conditions such as the positions of the top and lower stroke ends of the upper die, as well as the stroke length of the upper die, in order to meet a wide variety of through hole patterns and types of the die.

Additionally, it is to be pointed out that the through holes, after the punching, tend to be clogged with chips due to stickiness of the green sheet material. In case of a laminated substrate, the product must be rejected as being unacceptable even when one of the through holes is clogged. In order to avoid this problem, it is necessary to take an additional post-machining step to remove any clogging of the through holes. This post-machining, however, is quite troublesome and difficult to conduct because the through holes in the laminated ceramic substrate are extremely fine and the green sheet is deformable and flexible. Additionally, the post-machining undesirably degrades the dimensional precision such as the pitch of the through holes.

Accordingly, an object of the invention is to provide a punching method and apparatus for forming through holes in a workpiece which is mainly a ceramic green sheet, at a high efficiency and without suffering from clogging of the through holes with chips.

To this end, according to the invention, not only the positioning of the workpiece but also the driving of the upper die set are conducted by servomotors. The speed and timing of operation of the servomotors are controlled in accordance with a prestored program in a microcomputer, so as to attain a high speed and efficiency of operation. Additionally, a hole clearing operation is conducted immediately after the punching so that the chip remaining in the punched through hole, if any, is forced out therefrom by the same punch.

According to one feature of the invention, X-Y tables are disposed under a die, and the green sheet on a support member secured to an X-table, is movable between an upper die set and a lower die set of the die.

According to another feature of the invention, the upper die set forms the through holes in the green sheet by the punch in its downward stroke and then, before or after the upper die set reaches an end of its lower stroke, the microcomputer issues commands to instantaneously stop and reverse the servomotor to raise the upper die set.

Accordingly to still another feature of the invention, after the edge of the punch comes out of the green sheet during an upward stroke thereof, the indexing operation of the X-Y tables is started before or after the upper die set reaches an end of the upper stroke.

According to a further feature of the invention, after the edge of the punch projects out the green sheet during an upward stroke thereof, the downward and upward strokes of the upper die set are conducted again as required without conducting the indexing operation of the X-Y tables before or after the upper die set reaches the end of the upper stroke, so that the same through hole is punched two or more times by these punches.

BRIEF DESCRIPTION OF THE DRAWINGS

FIG. 1 is a schematic perspective view of an embodiment of a punching apparatus in accordance with the invention;

FIG. 2 is a time chart showing, by way of example, the positional relationship between the edge of a punch and the green sheet;

FIG. 3 is a time chart showing, by way of another example, the positional relationship between the edge of a punch and a green sheet;

FIG. 8 is a time chart showing, by way of still another example, a positional relationship between the edge of a punch and a green sheet.

DETAILED DESCRIPTION

Figure 4:
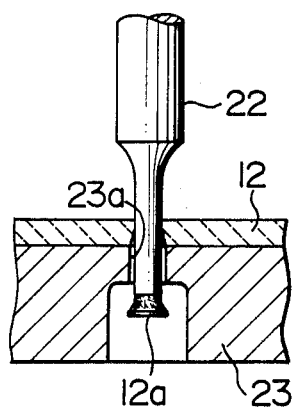
FIGS. 4 to 7 are enlarged sectional views taken along the line A—A of FIG. 1, showing the manner in which a through hole is formed by punching.

A preferred embodiment of the invention will be described hereinunder with reference to FIGS. 1 to 8.

Referring to the drawings, wherein like reference numerals are used throughout the various views to designate like parts and, more particularly, to FIG. 1, according to this figure a driving shaft of a servomotor 1 is coupled to a ball screw 2 by a coupling 3, with the ball screw 2 engaging a nut 4 press-fitted to a slider 5. The slider 5 is linearly movable along parallel rods 8, 9, borne on a housing 7 fixed to a head 6.

The punching apparatus has a die including an upper die set 11, with the die set 11 being connected to a free shank 10 fixed to the lower end of the slider 5. A punch (not shown) for punching a through hole in a green sheet 12 is embedded in the upper die set 11. The die also has a lower die set 13 fixed to a bed 14.

The punching apparatus further includes an X-Y tables including a Y-table 16 and an X-table 19. The Y-table 16 is carried by a Y-table housing 25 fixed to a base 24, and is linearly moved by a servomotor 15. The Y-table 16 carries an X-table housing 17 extending at a right angle to the Y-table 16. The X-table 19 is linearly moved on the X-table housing 17 by a servomotor 18. A support member 20, supporting the green sheet 12, is fixed on the X-table 19.

As apparent, the X-table 19 is movable in a horizontal plane under the bed 14 by the servomotors 15 and 18. This, in turn, permits the top portion of the support member 20 to move in a horizontal plane between the upper and lower die sets 11 and 13, in accordance with the horizontal movement of the X-table 19.

In operation, the servomotor drives the ball screw 2 upon receipt of a punching start signal from a microcomputer 21, so that the slider 5 moves linearly downwardly along the rods 8 and 9 to downwardly drive the upper die set 11. When the upper die set 11 contacts a portion of the lower die set 13, the edge of the punch projects from the lower face of the upper die set 11 to punch a through hole in the green sheet 12.

Then, the microcomputer 21 issues commands to instantaneously stop and then reverse the servomotor 1 so as to raise the upper die set 11 to a predetermined level. Subsequently, either one or both servomotors 15 and 18 operate in accordance with commands from the microcomputer 21 to drive the X-table 19 so that the green sheet 12 on the support member 20 is moved to a position for the punching of the next through hole. Then, the servomotor 1 operates in response to an operation command from the microcomputer 21 to move the upper die set 11 downwardly to punch the next through hole. This sequential operation is repeated in accordance with a program stored in the microcomputer 21, so that the required through holes are successively punched.

FIG. 2 is a time chart showing an example of the relationship between the position Z of the edge of the punch embedded in the upper die set 11 and the horizontal position of the green sheet 12. The top and lower stroke ends of the stroke of the punch edge are denoted by $Z_1$ and $Z_4$, respectively.

The upper die set 11 is positioned above the upper stroke end $Z_1$ of the punch edge, before commencing the punching operation and after a completion of the same. The punch edge Z is lowered from the upper stroke end $Z_1$ to the lower stroke end $Z_4$ to punch the through hole and is reversely moved upward to the upper stroke end $Z_1$, and then either one or both X- and Y-tables are moved to relocate the green sheet 12. Thus, the position control along the Z-axis and the position control along the X- and/or Y-axis are alternately conducted.

FIG. 3 shows a time chart of operation which is specifically intended for shortening the time of the punching operation. As shown in FIG. 3, a position $Z_2$ is set between the upper stroke end $Z_1$ and the position at which the upper die set 11 just leaves the green sheet 12 after the punching of the through hole. A position $Z_3$ is set between the lower stroke end $Z_4$ and the position at which the punch edge projects from the lower face of the green sheet 12 after the punching of the through hole.

Referring to FIG. 2, when the punch edge approaches the lower stroke end $Z_4$ during the downward stroke of the upper die set 11, an electric circuit automatically decelerates the punch, so that the velocity of downward movement of the punch when the punch edge reaches the lower stroke end $Z_4$ is as small as less than 1/10 of that at the mid point between the stroke ends $Z_1$ and $Z_4$. This controlling method effectively reduces the impact at a time of completion of the indexing but undesirably prolongs the indexing time. It is, however, possible to instantaneously stop and reverse the servomotor 1 even before the deceleration of the upper die set 11 during downward stroke is commenced, if the mass of the moving system is reduced by, for example, forming the upper die set 11 from, for example, an aluminum alloy, and sufficiently increasing the rigidity and strength of the driving system.

Referring again to FIG. 3, the microcomputer 21 issues a command to the servomotor 1 when the punch edge reaches the position $Z_3$ during downward stroke of the upper die set 11, so as to instantaneously stop and reverse the servomotor 1 thereby raising the upper die set 11. According to this method, the time required for one cycle of punching operation is shortened because the time duration in which the upper die set 11 is lowered from the position $Z_3$ to the lower stroke end $Z_4$ and returned to the position $Z_3$ can be advantageously eliminated. Then, the movement of the green sheet 12 for indexing can be commenced when the upper die set 11 reaches the position $Z_2$ during upward stroke of the upper die set 11. Accordingly, the time which is required for the upper die set 11 to move from the position $Z_2$ to the position $Z_1$ can be used for indexing of the green sheet 12.

The positions $Z_2$ and $Z_3$ may be set at any desired height within the range specified above. For example, when the stroke length, i.e., the distance between the upper and lower stroke ends $Z_1$ and $Z_2$ is selected to be 4 mm, the distance between the positions $Z_1$ and $Z_2$, and the distance between the positions $Z_3$ and $Z_4$, are selected to be 1 mm and 0.5 mm, respectively, the controlling method shown in FIG. 3 permits about 30% shortening of the punching time as compared with the case where the control is made in accordance with the controlling pattern shown in FIG. 1.

The punching method explained in connection with FIG. 3 may be further modified in such a manner as to effect a duplication of punching in order to prevent any clogging of the punched through hole with the chip formed as a result of the punching.

FIGS. 4 to 7 show the enlarged sectional views of the green sheet 12 and more clearly depict the manner in which the through hole is formed by a punch 22 which cooperates with a die 23. The die 23 is provided with a hole 23a of a diameter slightly greater than the diameter of the edge of the punch 22. The green sheet 12 is located while being held in contact with the upper face of the die 23.

Figure 5:
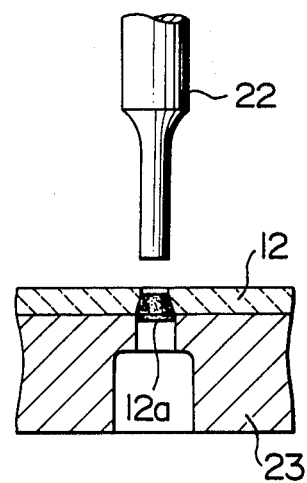

The green sheet 12 contains an organic binder and a plasticizer which generally exhibit tendency of sticking to the edge of the punch 22. It is, therefore, often experienced that the chip 12a, which is the material removed from the green sheet 12 as a result of the punching, sticks to the edge of the punch 22 due to strong punching pressure. The chip 12a, however, does not come off the punch 22 even after the edge of the punch 22 reaches the position $Z_3$ or $Z_4$ in FIG. 3 beyond an edge of the hole 23a formed in the die 23. In such a case, the chip 12a clogs the through hole after the punch 22 is moved upward to the position $Z_1$ in FIG. 2 or the position $Z_2$ in FIG. 3, as shown in FIG. 5.

Figure 6:
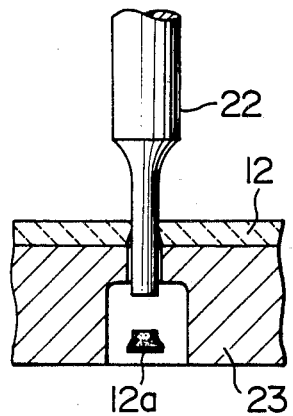
Figure 7:
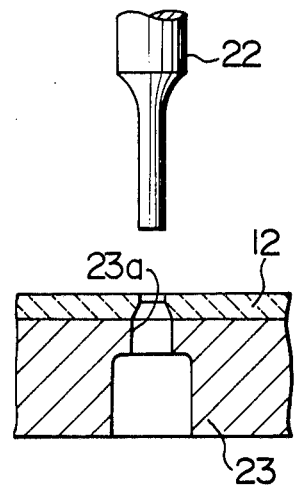

It has been experimentally confirmed that the chip clogging in the punched through hole can be forced out therefrom by a small force which is less than 5% of the punching force. Experiments also show that the sticking tendency is materially eliminated when the punch is brought into contact with the chip in the through hole with such small force. Therefore, when the punch 22 is driven again into the clogged through hole to the position $Z_3$, the chip 12a is forced out from the through hole and dropped naturally as shown in FIG. 6 and thus the through hole is clearly formed by the punching.

Thus, according to a feature of the invention, the punching is duplicated to clear the punched through hole by preventing any clogging of the through hole. It will be seen that, as the punching operation is commenced, the edge of the punch embedded in the upper die set 11 is lowered from the position $Z_1$ to the position $Z_3$ via the position $Z_2$ and then raised towards the position $Z_1$ again. However, when the punch edge reaches the position $Z_2$ during its upward movement, the upper die set is lowered again to the position $Z_3$ so as to force out any chip 12a from th punched through hole. Then, when the punch is raised again and, when the punch edge reaches the position $Z_2$, either one or both X- and Y-tables are operated to relocate the green sheet 12 for the punching of the next through hole. Meanwhile, the punch 22 continues its upward stroke together with the upper die set 11, until the edge of the punch reaches the position $Z_1$.

The punching method explained in connection with FIG. 8 ensures safe removal of any chip remaining in the punched through hole without requiring any substantial prolongation of the punching time. In this punching method, the second punching stroke for removing any chip remaining in the punched through hole need not always be started at the position $Z_2$ but also from any other suitable position. It is also possible to modify the program such that the punch is driven two or more times through the punched through hole. The adaptability of the punching apparatus as a whole will be increased if the number of stroke cycles and the second punching can be set freely by manipulation of a switch on the control panel or through a change in the sequence program.

As has been described, according to the invention, it is possible to easily change the content of the punching work through a simple modification of the program stored in the microcomputer, so that a single punching apparatus can be adapted to a wide variety of punching works, with minimal punching time. In addition, the yield of the green sheet substrate can be improved because the undesirable clogging of the punched hole can be avoided completely. Moreover, any post-machining for removing clogging chip and, therefore, any deterioration in the dimensional precision which may be caused by deformation of the sheet during the post-machining, can be advantageously eliminated.

What is claimed is:

1. A punching method for forming at least one through holes in a workpiece on an X-Y table system, the method comprising the steps of:
    setting a die to a home position in which said workpiece is disposed between an upper and a lower die set forming said die;
    table-driving servomotors for said X-Y table system to move said workpiece to a predetermined position;
    driving a die-driving servomotor for said die to move said die towards a punching position on said workpiece;
    driving said die-driving servomotor to bring said upper die said close to said lower die set;
    punching a through hole in said workpiece by said die;
    inversely driving said die-driving servomotor to displace an upper die said away from said lower die set;
    stopping said inverse driving of said die-driving servomotor before said upper die said is returned to the home position;
    driving said die-driving servomotor again to insert said upper die set into the punched hole;
    stopping the drive of said die-driving servomotor before said upper die set reaches a stroke end; and
    driving said die-driving servomotor inversely again to return said upper die set to said home position.

* * * * *